(12) United States Patent
Gilliland et al.

(10) Patent No.: US 7,330,353 B2
(45) Date of Patent: Feb. 12, 2008

(54) MODULAR HEAT SINK FIN MODULES FOR CPU

(75) Inventors: Don A. Gilliland, Rochester, MN (US); Dennis J. Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/426,345

(22) Filed: Jun. 26, 2006

(65) Prior Publication Data

US 2007/0297140 A1    Dec. 27, 2007

(51) Int. Cl.
*H05K 7/20* (2006.01)
*H01L 23/495* (2006.01)
*F28F 7/00* (2006.01)

(52) U.S. Cl. ............ 361/703; 361/697; 361/704; 257/675; 174/16.3; 165/80.3

(58) Field of Classification Search ........ 361/696–697, 361/702–703, 709, 712, 717–718, 704; 257/675; 174/16.3; 165/80.2–80.3
See application file for complete search history.

(56) References Cited

U.S. PATENT DOCUMENTS

| | | | |
|---|---|---|---|
| 5,247,734 A * | 9/1993 | Lubbe et al. ......... | 29/890.045 |
| 5,533,257 A * | 7/1996 | Romero et al. ......... | 29/890.03 |
| 5,786,985 A * | 7/1998 | Taniguchi et al. ......... | 361/707 |
| 5,815,371 A * | 9/1998 | Jeffries et al. ......... | 361/704 |
| 6,191,945 B1 * | 2/2001 | Belady et al. ......... | 361/704 |
| 6,371,200 B1 * | 4/2002 | Eaton ......... | 165/80.3 |
| 6,545,872 B1 * | 4/2003 | Lonergan et al. ......... | 361/719 |
| 6,698,500 B2 * | 3/2004 | Noda et al. ......... | 165/80.3 |
| 6,758,263 B2 * | 7/2004 | Krassowski et al. ......... | 165/185 |
| 6,845,013 B2 * | 1/2005 | Hartke et al. ......... | 361/704 |
| 2003/0136545 A1 * | 7/2003 | Lin et al. ......... | 165/80.3 |
| 2005/0103470 A1 * | 5/2005 | Mathews et al. ......... | 165/80.3 |
| 2006/0232932 A1 * | 10/2006 | Curtis et al. ......... | 361/697 |
| 2006/0285297 A1 * | 12/2006 | Conner et al. ......... | 361/710 |

* cited by examiner

*Primary Examiner*—Anatoly Vortman
*Assistant Examiner*—Bradley H Thomas
(74) *Attorney, Agent, or Firm*—Cantor Colburn LLP

(57) ABSTRACT

A modular heat sink and semiconductor chip assembly includes a semiconductor chip, a base plate disposed in a heat conducting relationship with the semiconductor chip and containing a plurality of slots extending through the base plate, a plurality of fins individually passed through a number of the plurality of slots and containing voltage-less input/output connections to facilitate grounding with the chip, and at least one electrical component passed through one of the plurality of slots and containing a high-density input/output structure on one edge and is electrically connected to the semiconductor chip.

7 Claims, 3 Drawing Sheets

MODULAR HEAT SINK FIN MODULES FOR CPU

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to circuit board space, and in particular to a modular heat sink configuration capable of reducing circuit board congestion.

2. Description of Background

Electronic devices utilize circuit boards to mount and electronically connect various components of the device. As requirements in features and performance of such devices increase, and because overall size should not increase, space on the circuit board is at a premium. In addition hereto, space within a semiconductor chip is also limited as such devices are very densely constructed.

One component often utilized within such electronic devices is a heat sink. Heat sinks help to conductively then convectively dissipate heat from a device such as a semiconductor chip. Heat sinks generally do not have electrical functionality and therefore occupy space in the electronic device without providing maximum benefit.

In addition to the foregoing, other components are located throughout the circuit board also occupying space thereon. For example, L2 cache memory, voltage regulation modules ("VRM"), etc., are components commonly found on circuit boards. The L2 cache is a type of memory that is commonly located on the circuit board and may be at some distance from the chip. When the L2 cache is installed in other locations on the circuit board, its function may be inefficient and affected by noise because of the distance between the chip and the L2 cache. Alternatively, the L2 cache can be incorporated into the chip circuitry. In such case, similar to when installed on the board, the L2 cache uses valuable space in the chip.

One or more VRMs are also commonly installed on the circuit board of electronic devices. A VRM is an electronic component that provides the appropriate supply voltage to a chip. It is typically located on the circuit board at a distance from the chip. Because of its location, the VRM's monitoring of the chip voltage is not optimal, and may be affected by noise because of its distance from the chip.

As indicated above, placing certain components at a distance from the chip has a negative effect on the components' performance. Additionally in the case of the L2 cache incorporated into the chip circuitry, the L2 cache uses space in the chip that may be better utilized in other ways. What is needed is a location for electronic components that is closer to the chip, but is not within the chip itself. Alternative configurations reducing congestion and improving performance would be well received by the art.

SUMMARY OF THE INVENTION

The present invention solves the aforementioned problems by incorporating one or more electronic components into the chip heat sink assembly.

This is accomplished by the creation of a modular heat sink assembly including a base plate including a plurality of through-slots and a plurality of fins that are individually inserted through each of the plurality of slots.

The modular heat sink assembly also includes at least one electronic component which utilizes a high-density input/output structure on one of its edges. The electronic component is inserted through one of the slots in the base plate so that the edge of the component including the high-density input/output connection is brought into direct contact with a semiconductor chip which abuts the modular heat sink assembly.

The modular heat sink assembly also includes one or more fins that include voltage-less input/output connections on one edge and are inserted through slots in the base plate. When each fin is inserted through the base plate, the edge of the fin including the voltage-less input/output connection is brought into direct contact with the semiconductor chip which abuts the modular heat sink.

These and other objects and features of the present invention will become more apparent from the following description taken in conjunction with the drawings.

TECHNICAL EFFECTS

The invention summarized above provides a location adjacent to the chip for components such as VRMs or L2 cache memory. By shortening the distance between these components and the chip, the components are not as affected by noise and thus their efficiency is increased because of the direct connection to the chip.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
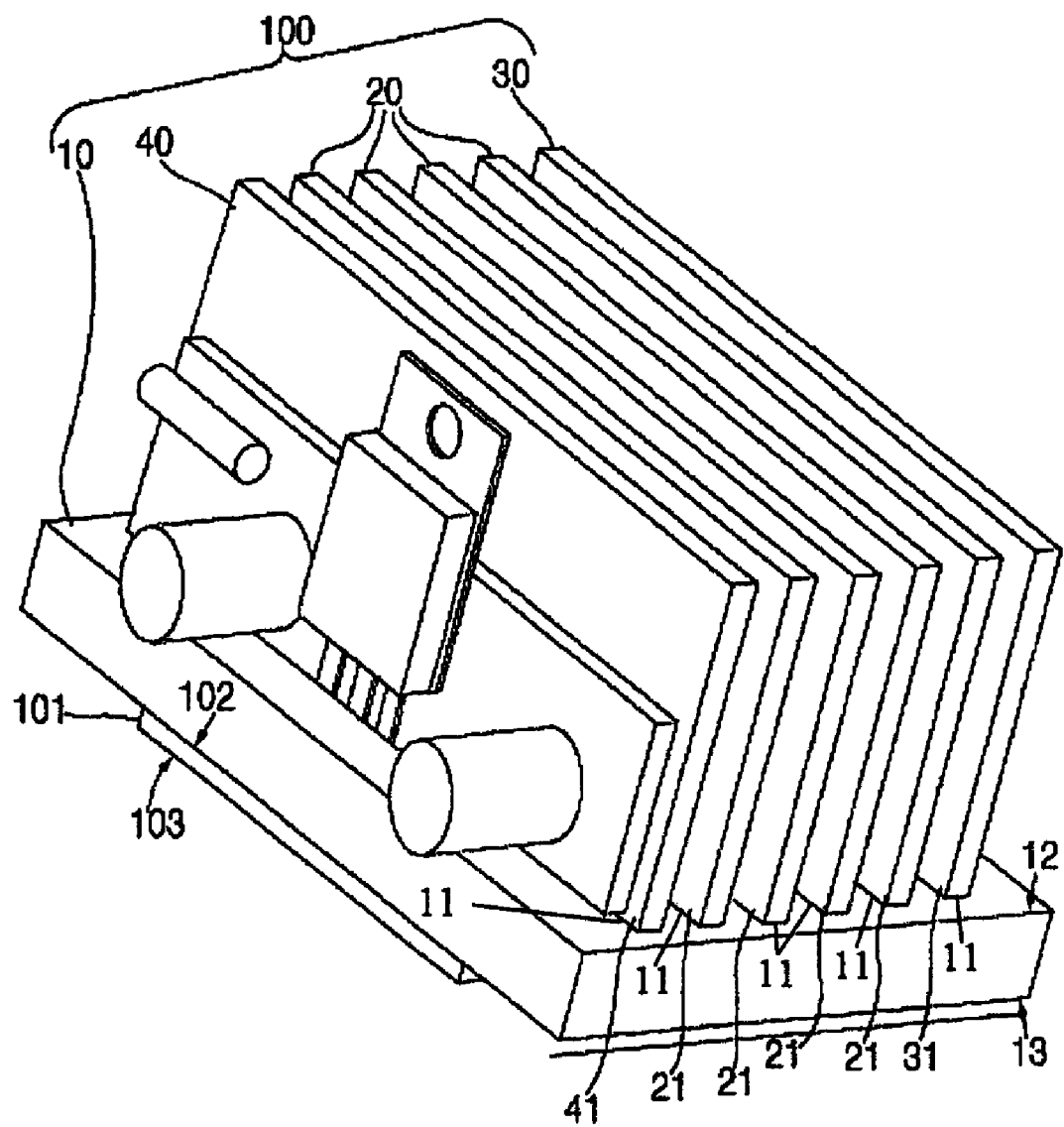
FIG. 1 is an isometric view illustrating one example of a modular heat sink according to the present invention.

Referring to FIG. 1, an embodiment of a modular heat sink 100 comprises a base plate 10, a plurality of heat sink fins 20 and one or more L2 cache memory fins 30 and/or one or more voltage regulator module ("VRM") fins 40. The modular heat sink assembly 100 is assembled to a semiconductor chip ("chip") 101 such that one face of the base plate 10 abuts a face 102 of the chip 101 that is opposite to a face 103 of the chip 101 that abuts a circuit board (not shown).

The base plate 10 is made of a heat conductive material. The base plate 10 has a plurality of slots 11 incorporated into it, one slot 11 for each fin to be included in the modular heat sink assembly 100. The slots 11 in the base plate 10 are created entirely through the base plate 10 from the face 13 abutting the chip 101 entirely through the base plate 10 to the face 12 opposite the face 13 abutting the chip 101.

One or more heat sink fins 20 are inserted individually through the slots 11 in the base plate 10 to make the modular heat sink assembly 100. In addition to or substitutionally, one or more L2 cache memory fins 30 and/or one or more VRM fins 40 may be inserted through a number of the slots 11. The quantity of each type of fin included in the modular heat sink assembly 100 depends on the desired electrical efficiency to be achieved and on the amount of cooling required to be achieved by the modular heat sink assembly 100.

Figure 2:
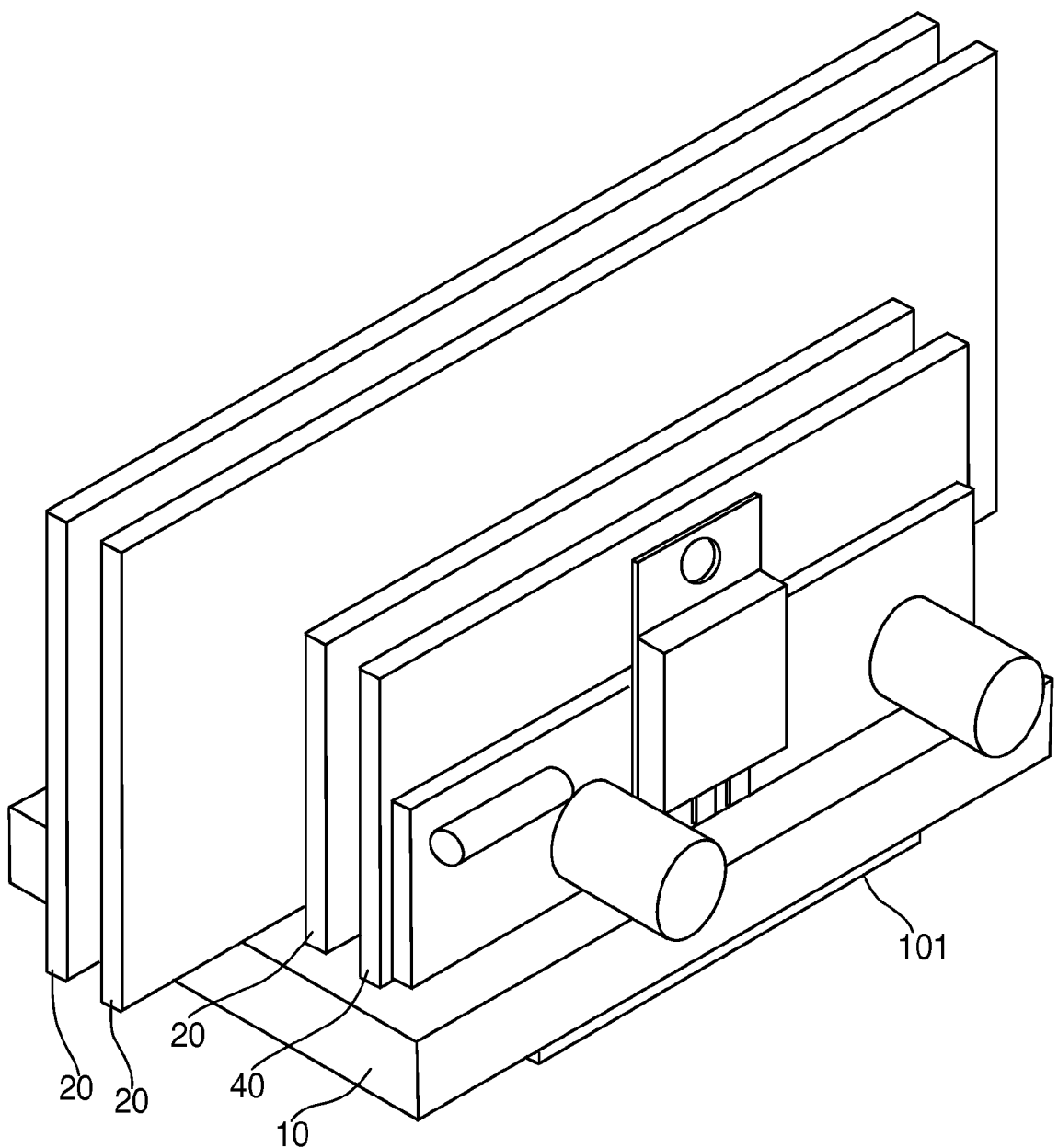
FIG. 2 is an isometric view of a modular heat sink assembly with variation in fin size.

Each heat sink fin 20 is made from a heat conductive material and is of the desired shape and size to achieve the desired cooling. Because of the design flexibility of the modular structure, the shape and size of each heat sink fin 20 can be optimized to compensate for cooling capacity of the modular heat sink assembly 100 that is lost or otherwise affected because of the incorporation of the other potentially non-cooling components into the modular heat sink assembly 100. An example of this is shown in FIG. 2. Referring to FIG. 2, the sizes of two heat sink fins 20 have been increased while the size of one heat sink fin 20 has not, to achieve the desired amount of cooling by the modular heat sink assembly 100.

Each heat sink fin 20 is provided with a voltage-less input/output connection on one edge 21. The heat sink fin 20 is inserted, edge 21 including the voltage-less input/output connection first, through the desired slot 11 in the base plate 10. Once inserted through the slot 11, edge 21 of the heat sink fin 20 is in direct contact with the face 102 of the chip 101. The voltage-less input/output connection on the edge 21 of the heat sink fin 20 is then directly connected to a corresponding voltage-less input/output connection provided on the face 102 of the chip 101 abutting the modular heat sink assembly 100, and thus is grounded. Each heat sink fin 20 is assembled through one of the slots 11 in the base plate 10 and connected to the chip 101 in this manner.

The modular heat sink assembly 100 may also include one or more L2 cache memory fins 30. Incorporating L2 cache memory allows for a greater total amount of L2 cache memory at the electronic device, and allows the L2 cache memory to be located outside of the chip 101 and off of the circuit board leaving additional space in those two areas to be used for other functions and/or capabilities.

Each L2 cache fin 30 includes a high-density input/output connection on one edge 31. The L2 cache fin 30 is inserted, edge 31 including the high-density input/output connection first, through the desired slot 11 in the base plate 10. Once inserted through the slot 11, edge 31 of the L2 cache fin 30 is in direct contact with the face 102 of the chip 101. The high-density input/output connection on the edge 31 of the L2 cache fin 30 then is directly connected to a corresponding high-density input/output connection provided on the face 102 of the chip 101 abutting the modular heat sink assembly 100, and thus is connected to the chip 101. Each L2 cache fin 30 is assembled through one of the slots 11 in the base plate 10 and connected to the chip 101 in this manner.

Figure 3:
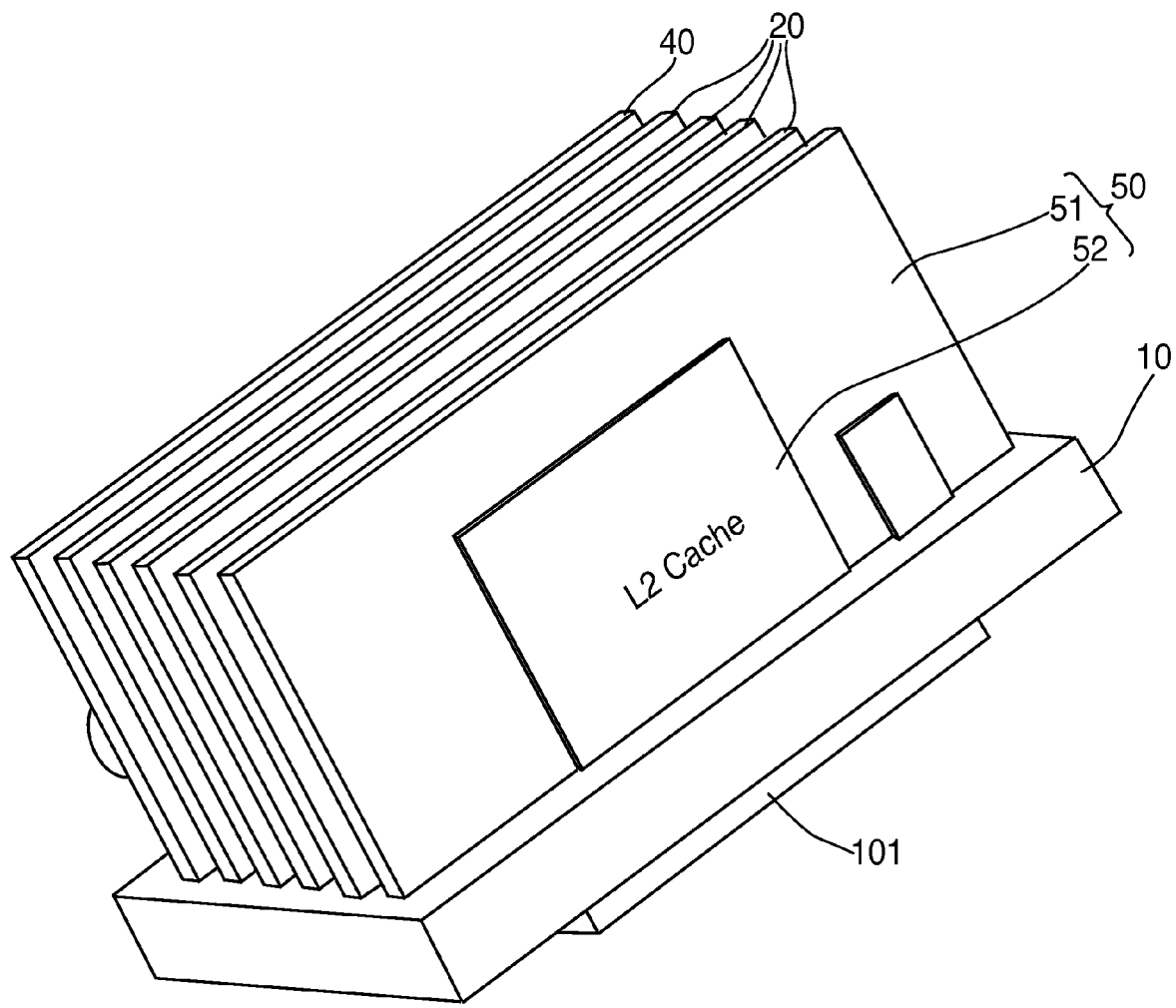
FIG. 3 is another isometric view of a heat sink assembly according to the present invention.

Additionally, in another embodiment, an L2 cache memory may be combined with a heat sink fin into a single fin that has cooling capability and also includes L2 cache memory capability. An example is shown in FIG. 3. A combined cooling/L2 cache fin 50 consists of a cooling portion 51 made of a heat conductive material, and an L2 cache portion 52 that fits into an area of the fin 50. The cooling portion 51 connects to the chip 101 via a voltage-less input/output connection as described above, and the L2 cache portion 52 connects to the chip 101 via a high-density input/output connection as described above. In this case, the connection area on the chip that corresponds to this combined cooling/L2 cache fin 50 must be provided with both a voltage-less input/output connection to accommodate the grounding of cooling portion 51, and a high-density input/output connection to accommodate the L2 cache portion 52.

A modular heat sink assembly 100 may also include one or more VRM fins 40. Including one or more VRM fins 40 in the modular heat sink assembly 100 removes the VRMs from the circuit board creating free space on the circuit board that may be used in other ways, and puts the VRMs in close proximity to the chip 101, allowing for more accurate monitoring of the voltage across the chip 101. Each VRM fin 40 includes an input/output connection on one edge 41. The VRM fin 40 is inserted, edge 41 including the input/output connection first, through the desired slot in the base plate 10. Once inserted through the slot 11, edge 41 of the VRM fin 40 is in direct contact with the face 102 of the chip 101. The input/output connection on the edge 41 of the VRM fin 40 then is directly connected to a corresponding input/output connection provided on the face of the chip 101 abutting the modular heat sink assembly 100, and thus is connected to the chip 101. Each VRM fin 40 is assembled through one of the slots 11 in the base plate 10 and connected to the chip 101 in this manner.

To facilitate direct electrical connection between the modular heat sink fins 20, 30, 40 and 50 described above and the chip 101, the chip 101 must be provided with the necessary input/output connections in the desired locations on the face 102 of the chip 101 that abuts the face 13 of the base plate 10. The chip 101 must be provided with a voltage-less input/output connection at each slot 11 location corresponding to each location of a cooling fin 20, a high density input/output connection at each slot 11 location corresponding to each location of a L2 cache fin 30, a input/output connection at each slot 11 location corresponding to each location of a VRM fin 40, and a combination of a voltage-less input/output connection and high density input/output connection at each slot location of each combined cooling/L2 cache fin 50.

While embodiments of the invention have been described above, it will be understood that those skilled in the art, both now and in the future, may make various improvements and enhancements which fall within the scope of the claims which follow. These claims should be construed to maintain the proper protection for the invention first described.

What is claimed is:

1. A modular heat sink and semiconductor chip assembly comprising:

a semiconductor chip, a base plate disposed in a heat conducting relationship with the semiconductor chip and containing a plurality of slots, the slots extending entirely through the base plate;

a plurality of fins individually passed through a number of the plurality of slots, the fins including voltage-less input/output connections facilitating grounding with the semiconductor chip; and at least one electrical component including a high-density input/output structure on one edge passed through one of the plurality of slots and the electrical component being electrically connected via the high-density input/output structure directly to a chip connection disposed on a face of the semiconductor chip.

2. The modular heat sink and semiconductor chip assembly of claim 1, wherein the plurality of fins including voltage-less input/output connections are cooling fins.

3. The modular heat sink and semiconductor chip assembly of claim 2, wherein one or more of the plurality of cooling fins are larger than others of the plurality of cooling fins.

4. The modular heat sink and semiconductor chip assembly of claim 1 where the at least one electrical component is an L2 cache module.

5. The modular heat sink and semiconductor chip assembly of claim 1 further comprising an additional electrical component.

6. The modular heat sink and semiconductor chip assembly of claim 5 where the additional electrical component is a voltage regulation module.

7. The modular heat sink and semiconductor chip assembly of claim 1 where the at least one electrical component is disposed within one of the plurality of fins and the fins includes the high-density input/output structure to electrically interconnect the at least one electrical component with the semiconductor chip.

* * * * *